US012725557B1

(12) United States Patent
Chen

(10) Patent No.: US 12,725,557 B1
(45) Date of Patent: Sep. 1, 2026

(54) DIGITAL-TO-ANALOG CONVERTER WITH IMPROVED TRANSIENT RESPONSE

(71) Applicant: NOVATEK Microelectronics Corp., Hsin-Chu (TW)

(72) Inventor: Chi-Ting Chen, Hsinchu City (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 19/096,639

(22) Filed: Mar. 31, 2025

(51) Int. Cl.
*G09G 3/20* (2006.01)
*H03K 19/21* (2006.01)
*H03M 1/66* (2006.01)

(52) U.S. Cl.
CPC ........... *G09G 3/2092* (2013.01); *H03K 19/21* (2013.01); *H03M 1/662* (2013.01); *G09G 2310/0297* (2013.01)

(58) Field of Classification Search
CPC ......... G09G 3/2092; G09G 2310/0297; H03K 19/21; H03M 1/662
See application file for complete search history.

(56) References Cited

U.S. PATENT DOCUMENTS 9,774,346 B2 9/2017 Chen
11,410,594 B1 * 8/2022 Chen .................... G09G 3/2007
2007/0046511 A1 * 3/2007 Morzano .............. G11C 7/1012 341/101
2009/0089599 A1 * 4/2009 Westwick ............. G06F 1/3243 323/283
2014/0070808 A1 * 3/2014 Reykowski ........ G01R 33/3628 324/309
2014/0117975 A1 * 5/2014 Shimomura ....... G01R 31/3835 327/408
2016/0300524 A1 * 10/2016 Chen ....................... H03M 1/76
2018/0075925 A1 * 3/2018 Hurrell ................ H03K 17/693
2018/0342210 A1 * 11/2018 Choi .................... G09G 3/3275
2019/0245543 A1 * 8/2019 Lee .................... H03K 19/1776
2021/0005592 A1 * 1/2021 Lee .................. H03K 19/17728
2021/0050300 A1 * 2/2021 Lin ..................... H10W 70/614
2022/0066282 A1 * 3/2022 Tzuang .................... G02F 1/311
2022/0353454 A1 * 11/2022 Bohannon ............ H04N 25/778
2024/0192336 A1 * 6/2024 Chen ...................... G01S 7/4865
2024/0195431 A1 * 6/2024 Rigo ..................... H03M 1/682
2024/0221588 A1 * 7/2024 Zhang ....................... G09G 3/20
2026/0004035 A1 * 1/2026 Lin ......................... G06F 30/34

FOREIGN PATENT DOCUMENTS

CN 106160746 11/2016
TW I544750 8/2016

* cited by examiner

*Primary Examiner* — Ryan A Lubit
(74) *Attorney, Agent, or Firm* — Winston Hsu

(57) ABSTRACT

A digital-to-analog converter (DAC) includes at least one multiplexer (MUX), wherein each of the MUX includes a plurality of basic switches and an assistant switch. The plurality of basic switches are coupled between an output terminal of the MUX and a plurality of input terminals of the MUX, and controlled by a plurality of grayscale codes. The assistant switch is coupled to the output terminal of the MUX, and controlled by a control signal different from each of the plurality of grayscale codes.

9 Claims, 9 Drawing Sheets

40
D[0] D[1] D[2] D[3]
CTRL
V1 V2 V3 V4 V5 V6 V7 V8 V9 V10 V11 V12 V13 V14 V15 V16
ASW1
SW1
VOUT
ASW2
SW2

DIGITAL-TO-ANALOG CONVERTER WITH IMPROVED TRANSIENT RESPONSE

BACKGROUND OF THE INVENTION

1. Field of the Invention

The present invention relates to a digital-to-analog converter (DAC), and more particularly, to a DAC for a source driver.

2. Description of the Prior Art

In a source driver for driving a display panel, the output voltage is provided from a digital-to-analog converter (DAC) according to a series of grayscale codes. Based on the grayscale codes, the DAC may select a desired gamma voltage from a resistor ladder. In order to rapidly recover the gamma voltages on the resistor ladder, certain gamma operational amplifiers (op-amps) may be operated as buffers to provide driving voltages to several tap nodes on the resistor ladder.

However, the resistor ladder is requested to provide voltages for hundreds or thousands of DACs and source op-amps in the source driver, especially for a large-scale display panel. In general, the source driver may be implemented in a thin and long integrated circuit (IC) which is deployed at the bottom of the display screen, where the gamma op-amps and the resistor ladder are included in a gamma circuit which is deployed in the center of the IC, and the DAC and source op-amp in each driving channel are uniformly distributed in the entire IC to be easily coupled to the corresponding data line on the display panel. With the increasing size of the display panel, the number of driving channels in the source driver may increase, and the length of the IC may also increase, such that the resistor ladder is connected to the driving channels in far ends through long conducting wires, which are accompanied by large parasitic resistance.

If the DAC selects a gamma voltage closer to a tap node connected to a gamma op-amp, the resistor ladder may be recovered in a faster speed through the driving of this gamma op-amp, and the DAC and the source op-amp may still have a fast transient response. However, if the DAC selects a gamma voltage which is farther from any tap node, the large RC time constant generated by the parasitic resistance of the long conducting wire will cause the output voltage of the source op-amp to change too slowly, which may affect the display image quality.

SUMMARY OF THE INVENTION

It is therefore an objective of the present invention to provide a digital-to-analog converter (DAC) for a source driver, which may reduce the parasitic resistance in the driving channel, thereby improving the transient response of the output voltage.

An embodiment of the present invention discloses a DAC, which comprises at least one multiplexer (MUX). Each of the at least one MUX comprises a plurality of basic switches and an assistant switch. The plurality of basic switches are coupled between an output terminal of the MUX and a plurality of input terminals of the MUX, and controlled by a plurality of grayscale codes. The assistant switch is coupled to the output terminal of the MUX, and controlled by a control signal different from each of the plurality of grayscale codes.

Another embodiment of the present invention discloses a display system, which comprises a display panel, a plurality of source operational amplifiers, a gamma circuit, a control circuit and a DAC. The plurality of source operational amplifiers are coupled to the display panel. The control circuit is to generate a control signal which is different from each of a plurality of grayscale codes. The DAC comprises a plurality of MUXs, and each of the plurality of MUXs has a plurality of input terminals coupled to the gamma circuit and an output terminal coupled to one of the plurality of source operational amplifiers, and comprises a plurality of basic switches and an assistant switch. The plurality of basic switches are coupled between the output terminal of the MUX and the plurality of input terminals of the MUX, and controlled by the plurality of grayscale codes. The assistant switch is coupled to the output terminal of the MUX, and controlled by the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
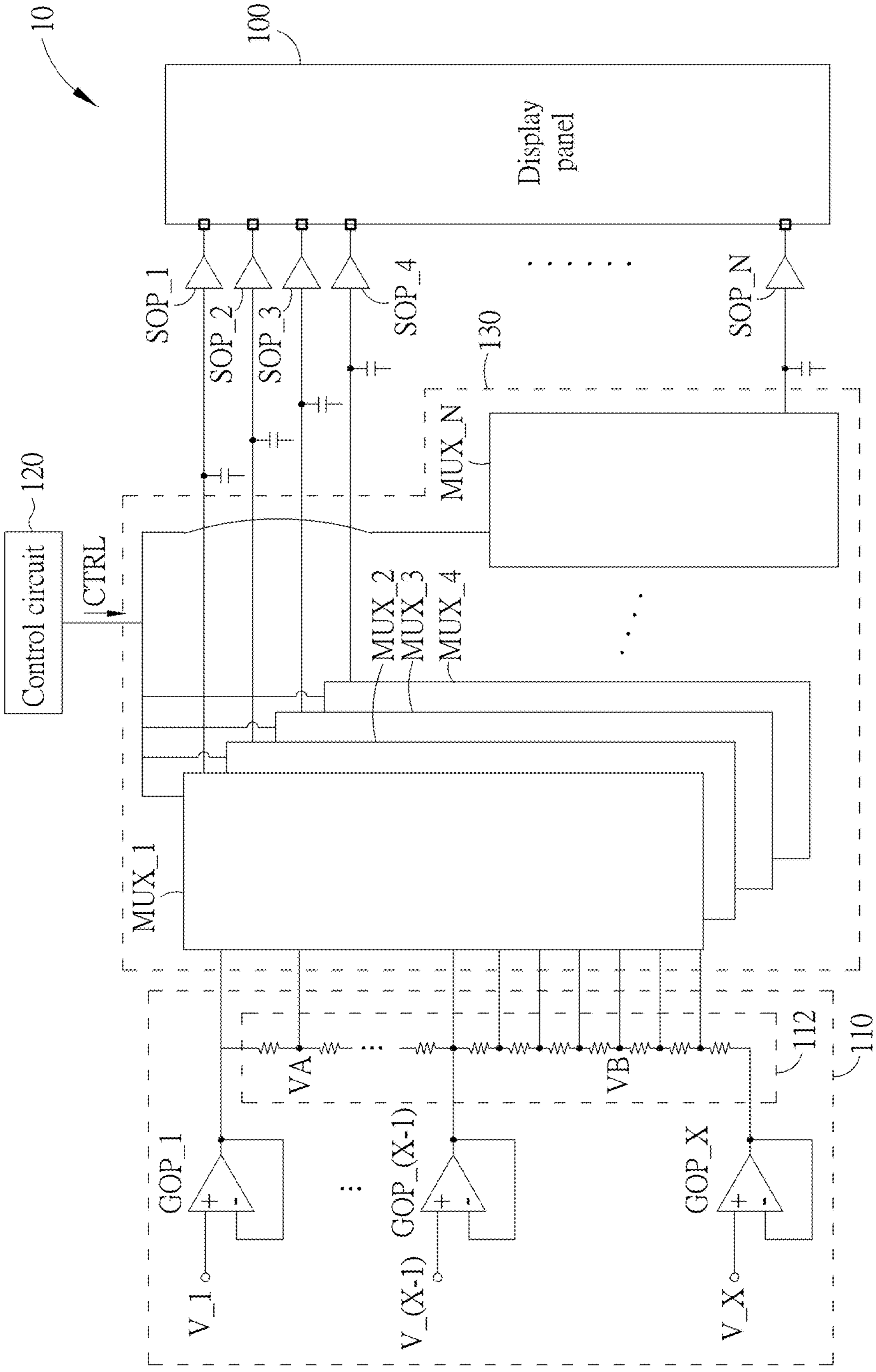
FIG. 1 is a schematic diagram of a display system according to an embodiment of the present invention.

FIG. 1 is a schematic diagram of a display system 10 according to an embodiment of the present invention. The display system 10 includes a display panel 100, a plurality of source operational amplifiers (op-amps) SOP_1-SOP_N, a gamma circuit 110, a control circuit 120 and a digital-to-analog converter (DAC) 130. The display panel 100 may be driven by a source driver. The source op-amps SOP_1-SOP_N and the DAC 130 may be included in the source driver for driving the display panel 100. In this embodiment, there are N driving channels included in the source driver, and thus the DAC 130 may include N multiplexers (MUXs) MUX_1-MUX_N, each coupled to a corresponding source op-amp among the source op-amps SOP_1-SOP_N. Therefore, each driving channel may include one of the source op-amps SOP_1-SOP_N and one of the MUXs MUX_1-MUX_N, where N may be any positive integer. The gamma circuit 110, which includes a resistor ladder 112 and a plurality of gamma op-amps GOP_1-GOP_X, may be included in or coupled to the source driver, to provide gamma voltages to be selected by the MUXs MUX_1-MUX_N of the DAC 130. The control circuit 120 may also be included in or coupled to the source driver, to output one or more control signals CTRL to the MUXs MUX_1-MUX_N of the DAC 130.

In detail, the display panel 100 may be any type of display device, which includes, but not limited to, a light emitting diode (LED) panel, organic LED (OLED) panel, and liquid crystal display (LCD) panel. In an embodiment, the display panel 100 may be a large-scale display screen, which has a great number of data lines that need to be driven by a great number of driving channels of a source driver.

In the gamma circuit 110, several predetermined source voltages V_1-V_X may be output to the resistor ladder 112 through the gamma op-amps GOP_1-GOP_X, respectively, where X may be any positive integer. Based on the source voltages V_1-V_X, the resistor ladder 112 may generate a great number of gamma voltages which can provide accurate brightness to be shown on the display panel 100. Each of the MUXs MUX_1-MUX_N may serve as a multiple-to-one switch, which has multiple input terminals coupled to the resistor ladder 112, to select and receive a gamma voltage from the resistor ladder 112 according to the grayscale codes. The grayscale codes, also referred to as grayscale data, data codes, display data, or image data, may be received from a shift register and a data latch (not illustrated). The grayscale codes record the grayscales required to be displayed on the display panel 100 in the form of digital data. In general, the grayscale codes may be provided from a timing controller.

In addition, each of the MUXs MUX_1-MUX_N may have an output terminal which is coupled to a corresponding source op-amp among the source op-amps SOP_1-SOP_N. The source op-amps SOP_1-SOP_N may further be coupled to the display panel 100. In each driving channel, the gamma voltage selected by the MUX MUX_1-MUX_N may be output to the corresponding data line on the display panel 100 through the source op-amp SOP_1-SOP_N. Each of the source op-amps SOP_1-SOP_N may output the corresponding output voltage to the target pixel on the display panel 100, respectively.

The control circuit 120 may provide the control signal (s) CTRL to each of the MUXs MUX_1-MUX_N. According to the present invention, the MUXs MUX_1-MUX_N may receive the grayscale codes as well as the control signal CTRL. The grayscale codes may determine the level of the selected output voltage. The control signal CTRL helps reduce the resistance on the signal path, thereby improving the transient response of the output voltage which is output to the display panel 100.

Figure 2:
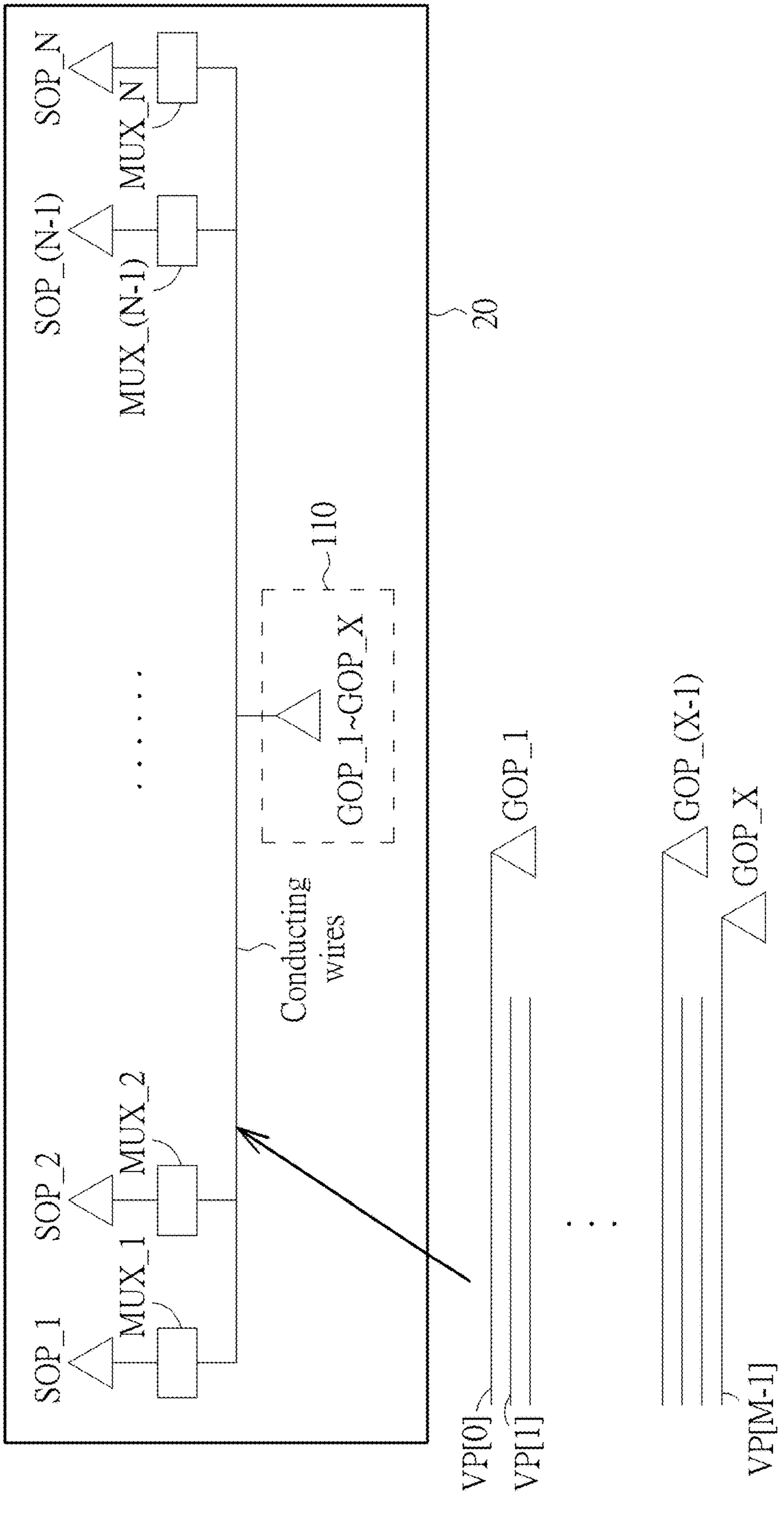
FIG. 2 illustrates a general layout structure of a source driver.

FIG. 2 illustrates a general layout structure of a source driver 20, which includes detailed implementations of the source op-amps SOP_1-SOP_N coupled to the MUXs MUX_1-MUX_N. In various embodiments, the source driver 20 may be implemented in the display system 10 shown in FIG. 1. Referring to FIG. 2 along with FIG. 1, the source driver 20 may be implemented in a thin and long integrated circuit (IC), with the gamma circuit 110 deployed in the center of the IC. In the gamma circuit 110, each gamma op-amp GOP_1-GOP_X is coupled to a corresponding tap node on the resistor ladder 112, to supply the source voltage V_1-V_X through the tap node, respectively, to drive the resistor ladder 112 to output accurate gamma voltages. In other words, if a gamma voltage is selected by several driving channels, these driving channels may draw currents from the resistor ladder 112, and the gamma op-amps GOP_1-GOP_X will supply sufficient currents to drive the resistor ladder 112 and keep the gamma voltage stable.

The resistor ladder 112 is configured to output a greater number of gamma voltages VP[0]-VP[M−1] for various display data, where M may be any positive integer. In general, the resistor ladder 112 may provide thousands of gamma voltages VP[0]-VP[M−1] for the driving channels, i.e., M may be greater than 1000. In an exemplary embodiment, if the grayscale code is a 10-bit data, M may be equal to $2^{10}$=1024. However, considering the cost issue, the resistor ladder 112 may be controlled by only a few or several tens of gamma op-amps GOP_1-GOP_X, i.e., X may be a small number such as 8 or 10 or 12. The tap nodes coupled to the gamma op-amps GOP_1-GOP_X may be uniformly distributed on the resistor ladder 112.

In the source driver 20, the MUXs MUX_1-MUX_N and the source op-amps SOP_1-SOP_N in the driving channels may be uniformly distributed in the entire IC. Therefore, there may be M thin and long conducting wires spread over the entire IC, to respectively forward the M gamma voltages VP[0]-VP[M−1] to the MUXs MUX_1-MUX_N from the gamma circuit 110. In an exemplary embodiment, M is equal to 1024, so there will be 1024 conducting wires connected between the gamma circuit 110 and each MUX MUX_1-MUX_N. Referring to FIG. 2 along with FIG. 1, assuming that a specific MUX may select a voltage VB in the previous time period and select another voltage VA in the present time period, the voltage transition from VB to VA may possess an RC delay which is generated from the resistance and capacitance on the voltage delivery path. The capacitance is mainly provided from the parasitic capacitor of the conducting wires, of which the value is small since the conducting wires are thin metal wires. The resistance, which dominates the RC delay, is mainly provided from the parasitic resistor of the conducting wires and the resistors in the resistor ladder 112. If a driving channel is farther from the gamma circuit 110, the required conducting wires will be longer, resulting in a large parasitic resistor. In addition, if the selected gamma voltage is farther from any tap node on the resistor ladder 112, the resistors between the selected voltage output node and the tap node also provide a large contribution to the RC delay. The RC delay will slow down the delivery of the gamma voltage to the MUX of the DAC, such that the output voltage of the source driver may not be timely settled to its target value, which may result in a defect image. In addition, if there are a great number of driving channels selecting the same gamma voltage, these driving channels will draw currents from the same node on the resistor ladder 112; hence, the slow settling problem may become severe.

Note that in the embodiment shown in FIG. 1, the DAC 130 includes multiple MUXs MUX_1-MUX_N configured to select gamma voltages from the resistor ladder 112 of the gamma circuit 110. In another embodiment, the resistor ladder 112 may be included in the DAC 130; hence, each GOP GOP_1-GOP_X in the gamma circuit 110 may output a source voltage V_1-V_X as a tap voltage to the DAC 130. The resistor ladder 112 thereby generates the gamma voltages based on the tap voltages provided from the gamma circuit 110. Alternatively or additionally, the source driver 20 may include multiple DACs, where each DAC may include one or more MUXs, which are commonly coupled to a resistor ladder to receive the gamma voltages.

Figure 3:
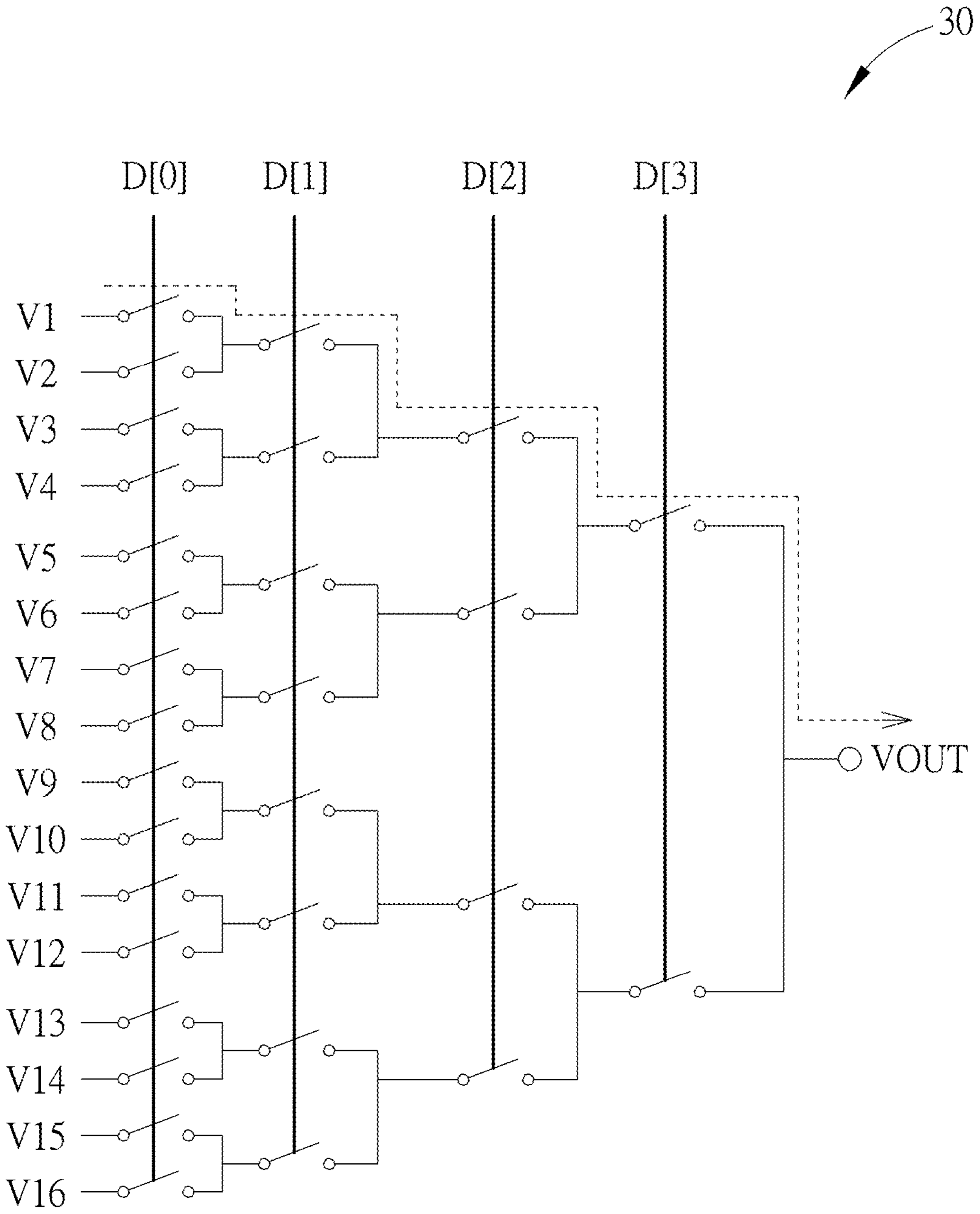
FIG. 3 is a schematic diagram of a general DAC.

FIG. 3 is a schematic diagram of a general MUX 30. The MUX 30 includes an output terminal and multiple input terminals. The MUX 30 is configured to generate an output voltage VOUT on its output terminal, and receive multiple gamma voltages V1-V16 through its input terminals. The output voltage VOUT may be output to a corresponding source op-amp, and the gamma voltages V1-V16 may be received from a resistor ladder. The output voltage VOUT is selected from the gamma voltages V1-V16 based on the received grayscale codes. In this embodiment, the MUX 30 receives 4-bit grayscale codes D[3:0], to select one of the gamma voltages V1-V16 as the output voltage VOUT. Note that FIG. 3 merely shows 16 gamma voltages receivable by the MUX 30 based on the control of the 4-bit grayscale codes D[3:0]. In a practical embodiment, the MUX may receive 8-bit grayscale codes, and thus its output voltage is selected from $2^8$=256 gamma voltages; or the MUX may receive 10-bit grayscale codes, and thus its output voltage is selected from $2^{10}$=1024 gamma voltages.

As shown in FIG. 3, the MUX 30 includes multiple switches coupled between its output terminal and input terminals. Each of the switches may be controlled by one of the grayscale codes D[3:0]. With appropriate implementations of the switches and the grayscale codes D[3:0] shown in FIG. 3, the MUX 30 may generate the output voltage VOUT according to the grayscale codes D[3:0]. In an exemplary embodiment, assuming that the gamma voltages V1-V16 are from the minimum to the maximum, and that a grayscale code equal to "0" corresponds to a smaller voltage level and a grayscale code equal to "1" corresponds to a larger voltage level, the grayscale codes D[3:0] may be equal to "0000", to control the MUX 30 to select the gamma voltage V1 as the output voltage VOUT, as shown in FIG. 3.

Figure 4:
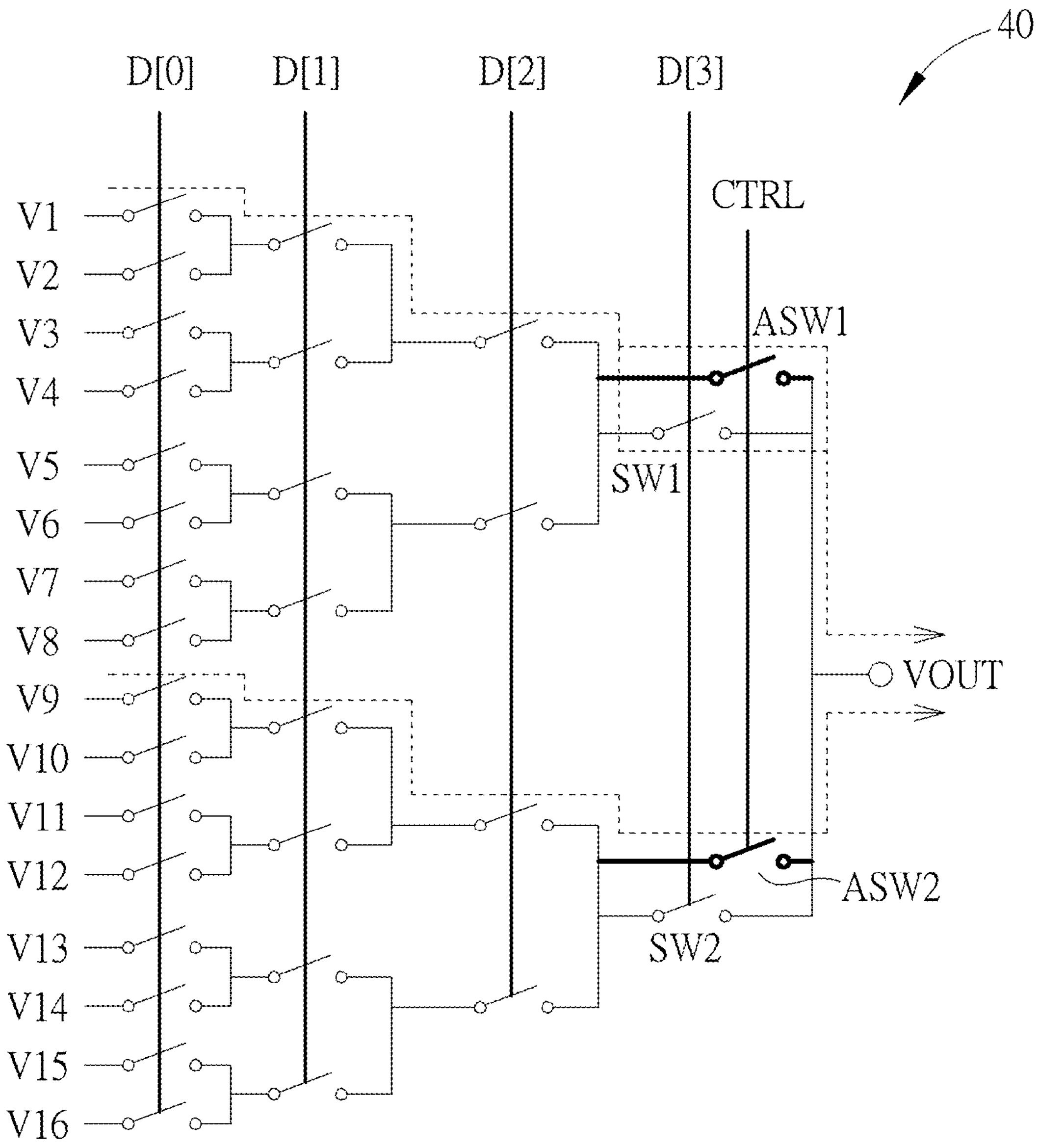
FIG. 4 is a schematic diagram of a DAC according to an embodiment of the present invention.

FIG. 4 is a schematic diagram of a MUX 40 according to an embodiment of the present invention. Similarly, as a multiple-to-one switch, the MUX 40 is configured to generate an output voltage VOUT on its output terminal by receiving multiple gamma voltages V1-V16 through its input terminals. Although the MUX 40 only receives 4-bit grayscale codes D[3:0] to select the output voltage VOUT from 16 gamma voltages V1-V16, a skilled person would be able to infer that the output voltage of the MUX may be selected from 2N gamma voltages by receiving N-bit grayscale codes, where N may be any positive integer such as 8 or 10.

In the embodiment shown in FIG. 4, in addition to receiving the grayscale codes D[3:0], the MUX 40 may also receive a control signal CTRL, which may be provided by a control circuit, so that the control signal CTRL is different from any of the grayscale codes D[3:0]. The MUX 40 may be any of the MUXs MUX_1-MUX_N included in the display system 10, which receives the control signal CTRL from the control circuit 120 as shown in FIG. 1.

The MUX 40 includes a plurality of basic switches and 2 assistant switches ASW1 and ASW2. The basic switches are those switches controlled by the grayscale codes D[3:0], similar to the switches included in the MUX 30 shown in FIG. 3. The assistant switches ASW1 and ASW2 are coupled to the output terminal of the MUX 40, and controlled by the control signal CTRL. As shown in FIG. 4, the assistant switch ASW1 is connected in parallel with the upper basic switch controlled by the grayscale code D[3](i.e., SW1), and the assistant switch ASW2 is connected in parallel with the lower basic switch controlled by the grayscale code D[3] (i.e., SW2). In an exemplary embodiment, the assistant switches ASW1 and ASW2 may be turned off when the control signal CTRL is equal to "0", and turned on when the control signal CTRL is equal to "1".

As shown in FIG. 4, when the grayscale codes D[3:0] equal "0000" while the control signal CTRL equals "1", the voltage delivery path between the input gamma voltage V1 and the output voltage VOUT is conducted, with the basic switches turned on by the grayscale codes D[3:0] and the assistant switch ASW1 turned on by the control signal CTRL, where the assistant switch ASW1 and the basic switch SW1 are conducted simultaneously. In addition, the voltage delivery path between the input gamma voltage V9 and the output voltage VOUT is also conducted, with the basic switches turned on by the grayscale codes D[2:0] and the assistant switch ASW2 turned on by the control signal CTRL. In such a situation, there are two parallel connected voltage delivery paths between the output terminal of the MUX 40 and the resistor ladder 112, causing that the overall resistance between the output terminal of the MUX 40 and the resistor ladder 112 is reduced, thereby reducing the RC delay and accelerating the voltage transition operation.

In various embodiments, the assistant switches ASW1 and ASW2 may be turned on when any of the grayscale codes D[3:0] changes. When at least one of the grayscale codes D[3:0] changes, the MUX 40 may select another gamma voltage, and thus the output voltage VOUT may transit to a new level. The voltage transition is affected by an RC delay due to the parasitic resistance on the voltage delivery path as described above. Therefore, the control signal CTRL may turn on the assistant switches ASW1 and ASW2 at the same time to control two voltage delivery paths connected in parallel to be conducted simultaneously, and thus the overall parasitic resistance and the RC delay may be reduced.

Figure 5:
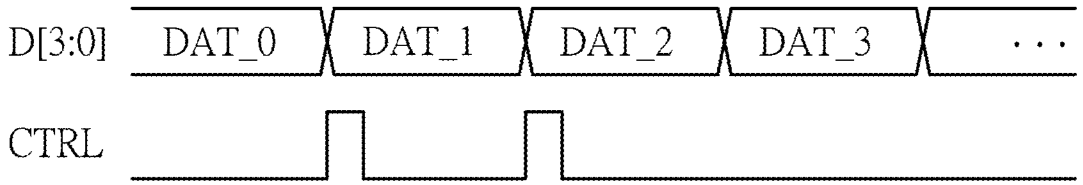
FIG. 5 is a waveform diagram of the DAC according to an embodiment of the present invention.

FIG. 5 is a waveform diagram of the MUX 40 according to an embodiment of the present invention, where the waveforms of the grayscale codes D[3:0] and the control signal CTRL are shown. As shown in FIG. 5, a short pulse is generated on the control signal CTRL when the data value of the grayscale codes D[3:0] changes, e.g., from DAT_0 to DAT_1 or from DAT_1 to DAT_2, where DAT_0, DAT_1 and DAT_2 are different. The change of the grayscale codes D[3:0] refers to any of the data bits of the grayscale codes D[3:0] changing state. The short pulse may turn on the corresponding assistant switches for a predetermined period of time, to reduce the parasitic resistance and the RC delay, thereby improving the transient response of the output voltage VOUT of the MUX 40.

In an embodiment, the pulse of the control signal CTRL may be generated only when at least one of the grayscale codes D[3:0] changes, and may not be generated when none of the grayscale codes D[3:0] changes. This is because the output voltage VOUT does not transit its level if the grayscale codes D[3:0] do not change, and thus there is no transient response problem of voltage transition. For example, as shown in FIG. 5, the data values DAT_2 and DAT_3 of the grayscale codes D[3:0] are equal, and thus no pulse is generated in the control signal CTRL in the time period of the data value DAT_3.

Note that the present invention aims at providing the structure of a MUX included in a DAC for a source driver to reduce the parasitic resistance that may result in the RC delay of the output voltage. Those skilled in the art may make modifications and alterations accordingly. For example, in various embodiments of the present invention, the control signal for the MUXs may be generated in any possible manner. In the embodiment shown in FIG. 1, the control circuit 120 outputs the control signal CTRL to each of the MUXs MUX_1-MUX_N. In fact, each of the MUXs MUX_1-MUX_N may receive a respective control signal CTRL, on which the pulse may be generated according to the grayscale codes D[3:0] received by the corresponding MUX. For example, during two consecutive display line periods, if the grayscale codes for a first MUX (e.g., MUX_1) change while the grayscale codes for a second MUX (e.g., MUX_2) do not change, the control signal for the first MUX may have a pulse, but the control signal for the second MUX may have no pulse. In another embodiment, each of the MUXs MUX_1-MUX_N may be coupled to a respective control circuit, to receive the respective control signal from the corresponding control circuit.

In addition, the levels of the input voltages of the MUX are not limited. For example, in the MUX 40, the levels of the gamma voltages V1-V16 may be in an ascending order or descending order, with appropriate values of the grayscale codes D[3:0] to control the output voltage VOUT. In other embodiments, the levels of the gamma voltages V1-V16 may not be in the ascending or descending order, and/or may be in a scrambled order. For example, the gamma voltage V2 may be greater than the gamma voltage V3, and the gamma voltage V3 may further be greater than the gamma voltage V1. In such a situation, the grayscale codes D[3:0] received by the MUX 40 may be well designed or adjusted to obtain the desired value of the output voltage VOUT.

Also note that the implementation of the assistant switches shown in FIG. 4 is merely an example. In various embodiments of the present invention, the assistant switch may be connected in parallel with any basic switch in the MUX.

Figure 6:
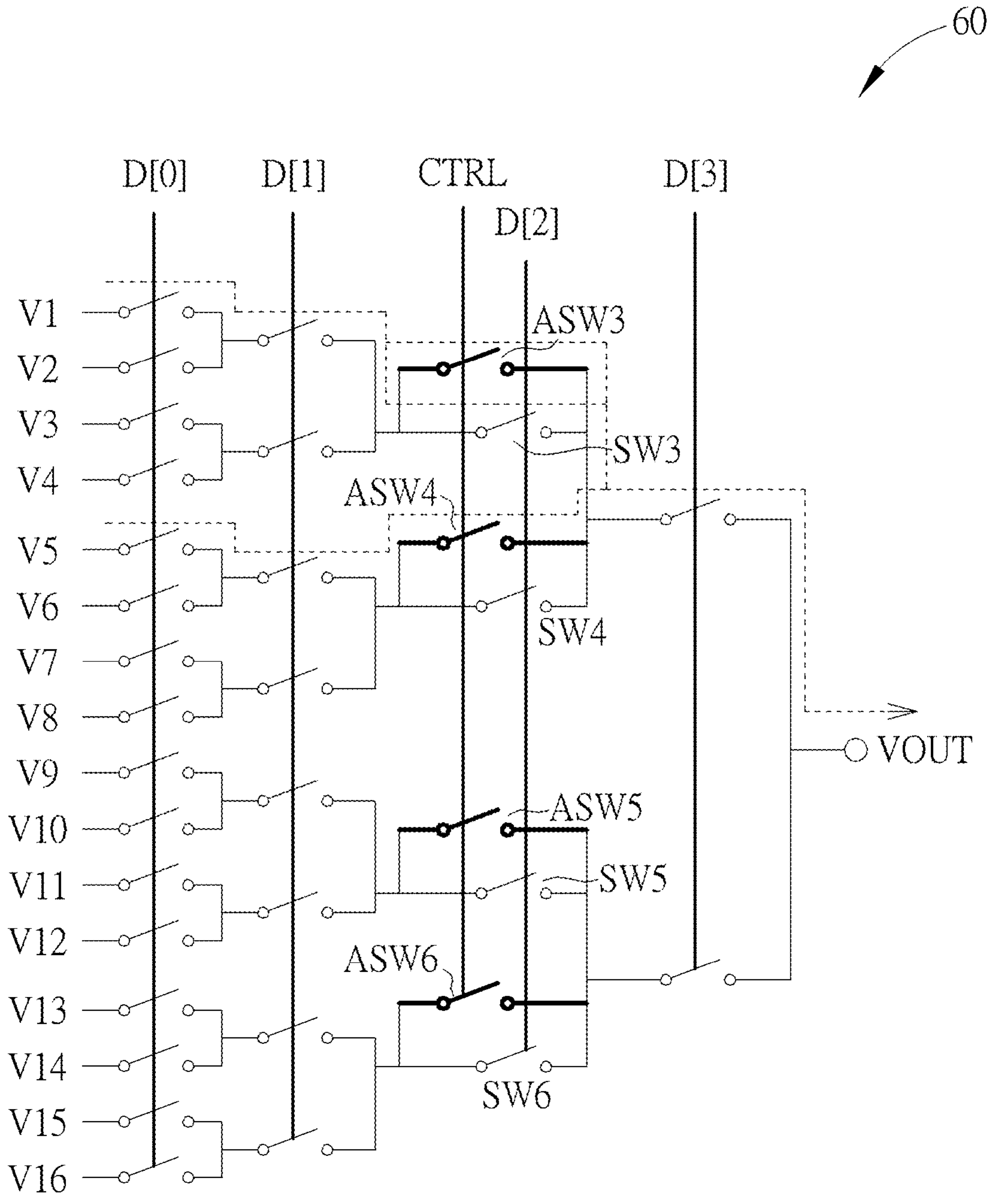
FIG. 6 to FIG. 9 are schematic diagrams of DACs according to embodiments of the present invention.

FIG. 6 is a schematic diagram of a MUX 60 according to an embodiment of the present invention. Similarly, to facilitate the illustrations, the MUX 60 is configured to generate an output voltage VOUT on its output terminal by receiving 16 gamma voltages V1-V16 through its input terminals. In this embodiment, the MUX 60 includes a plurality of basic switches and 4 assistant switches ASW3-ASW6, where the basic switches are implemented as similar to those in the MUX 40. Different from the assistant switches ASW1 and ASW2 in the MUX 40, the assistant switches ASW3-ASW6 included in the MUX 60 are respectively connected in parallel with 4 basic switches controlled by the grayscale code D[2](i.e., SW3-SW6).

The operations of the MUX 60 are similar to the operations of the MUX 40. When any of the grayscale codes D[3:0] changes, a pulse may be generated on the control signal CTRL to turn on the assistant switches ASW3-ASW6. Assuming that the grayscale codes D[3:0] equal "0000", the voltage delivery path between the input gamma voltage V1 and the output voltage VOUT and the voltage delivery path between the input gamma voltage V5 and the output voltage VOUT are conducted, to form two parallel connected voltage delivery paths between the output terminal of the MUX 60 and the resistor ladder 112, causing that the overall resistance between the output terminal of the MUX 60 and the resistor ladder 112 is reduced, thereby accelerating the voltage transition operation.

Preferably, the assistant switch is connected in parallel with a basic switch most closely connected to the output terminal of the MUX. Referring to FIG. 4 along with FIG. 6, the assistant switches ASW1-ASW2 in the MUX 40 and the assistant switches ASW3-ASW6 in the MUX 60 may achieve a similar effect that forms two parallel connected voltage delivery paths conducted simultaneously to reduce the RC delay, where the MUX 60 needs 4 assistant switches ASW3-ASW6 but the MUX 40 only needs 2 assistant switches ASW1-ASW2. In such a situation, the MUX 40 further has the benefit of cost reduction since it includes a fewer number of assistant switches.

Figure 7:
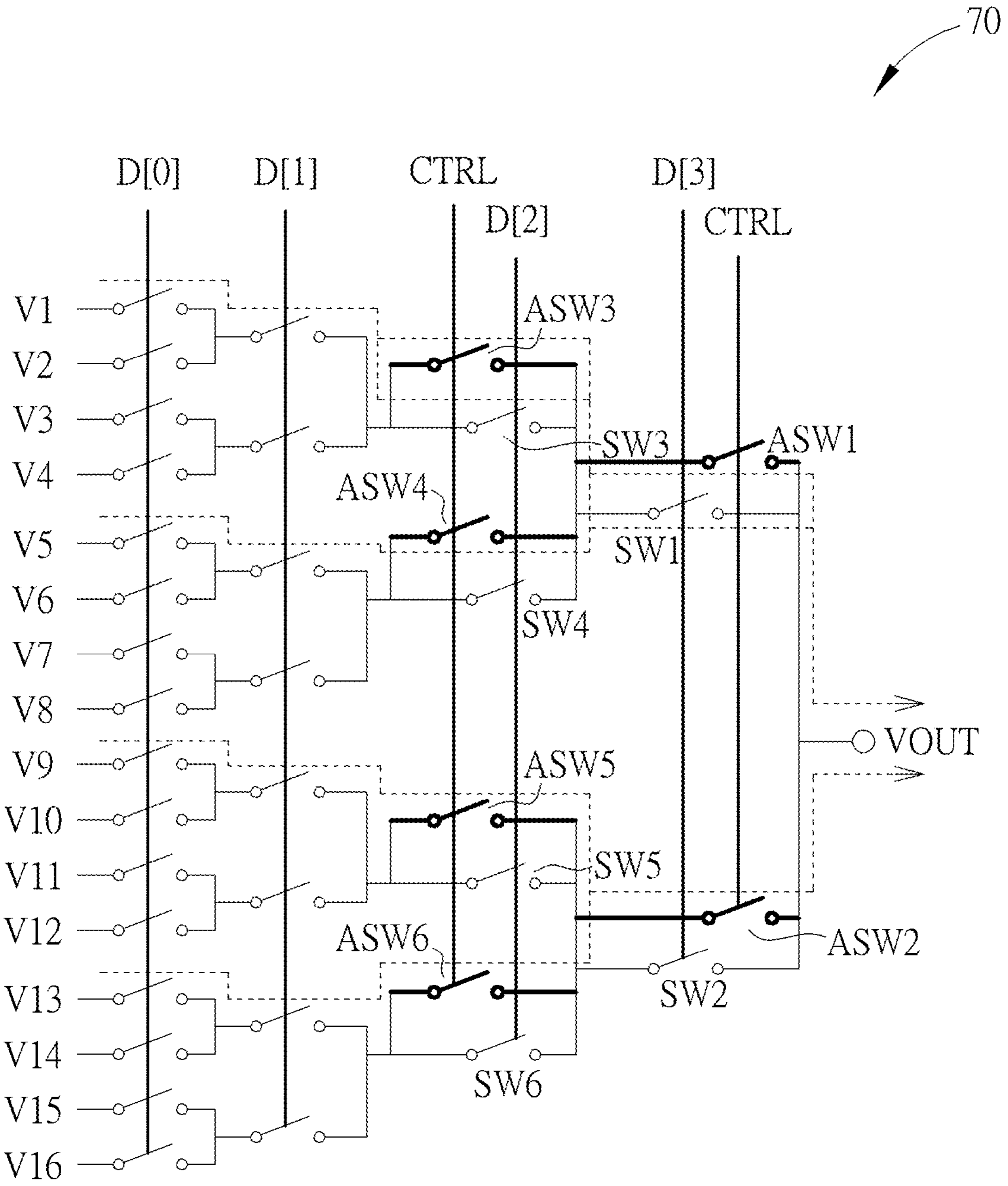

In another embodiment, more assistant switches may be included to further reduce the RC delay and improve the transient response of the output voltage. For example, the assistant switches ASW1-ASW6 of the MUXs 40 and 60 may be all included in a MUX 70, as shown in FIG. 7. In such a situation, when the grayscale codes D[3:0] equal "0000" and the control signal CTRL equals "1", there may be 4 parallel connected voltage delivery paths conducted simultaneously, which means that the resistance between the resistor ladder and the output terminal of the MUX 70 may be reduced to ¼ of original.

In the above embodiments, a MUX includes multiple assistant switches coupled to all the basic switches controlled by one grayscale code such as D[3] or D[2]. In another embodiment, a MUX may include one or more assistant switches coupled to partial basic switches controlled by one grayscale code. In other words, the deployments of the upper half part and the lower half part of the MUX may not be symmetric.

Figure 8:
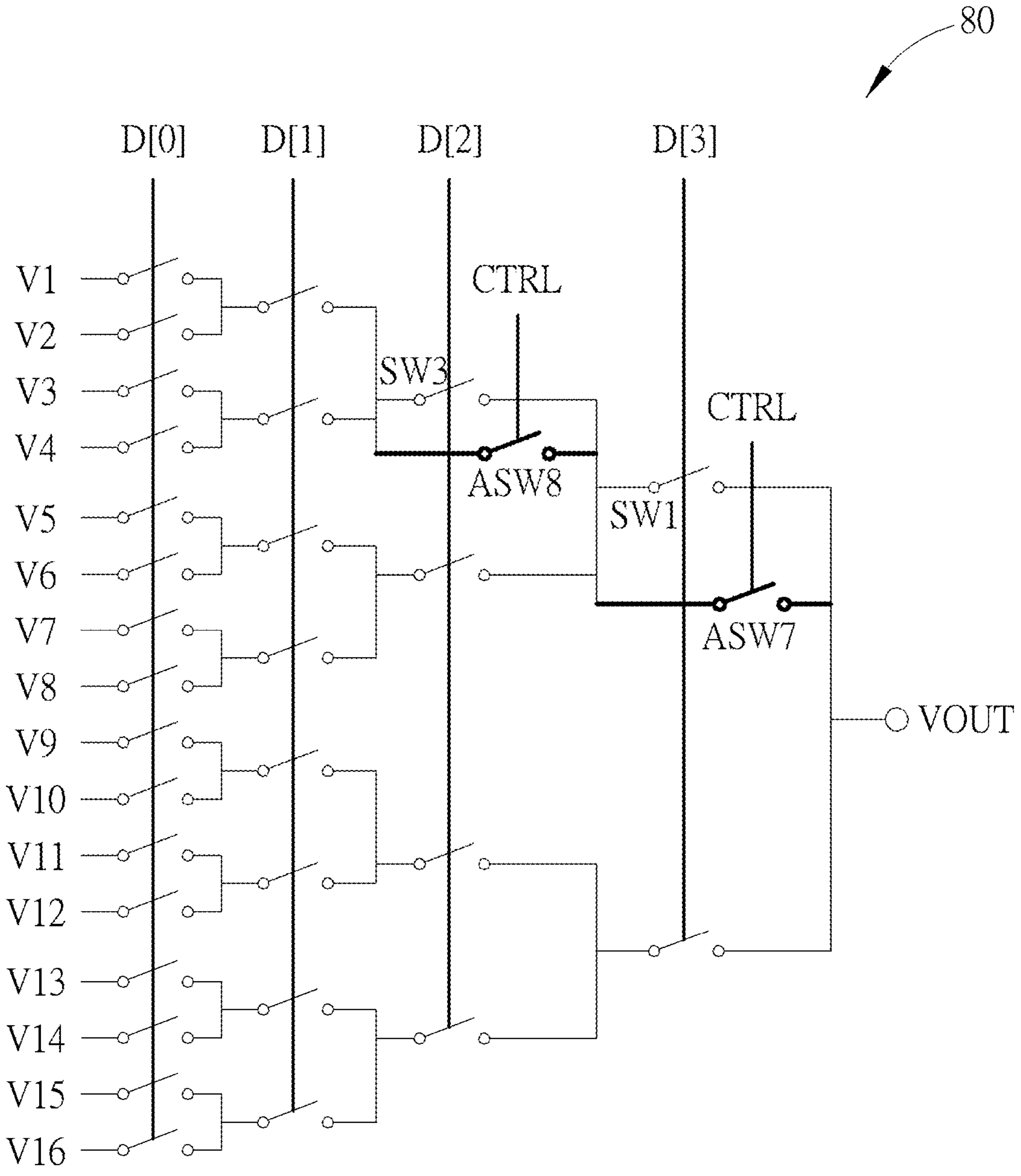

For example, FIG. 8 is a schematic diagram of another MUX 80 according to an embodiment of the present invention. The structure of the MUX 80 is similar to the structure of the MUX 70, so signals and elements having similar functions are denoted by the same symbols. The difference between the MUX 80 and the MUX 70 is that, the MUX 80 only includes 2 assistant switches ASW7 and ASW8. The assistant switch ASW7 is connected in parallel with the upper basic switch controlled by the grayscale code D[3] (i.e., SW1), and the assistant switch ASW8 is connected in parallel with the most upper basic switch controlled by the grayscale code D[2](i.e., SW3). The detailed operations of the assistant switches ASW7 and ASW8 included in the MUX 80 and the related control signal CTRL are similar to those in the above embodiments, and will not be repeated herein.

In an embodiment, the MUX of the present invention may include only one assistant switch which is connected in parallel with any basic switch in the MUX, such as a basic switch controlled by the most significant bit (MSB) of the grayscale code, e.g., the basic switch SW1 or SW2 in the above embodiments. Alternatively or additionally, the MUX of the present invention may include any number of assistant switches, where each assistant switch may be connected in parallel with any basic switch in the MUX. In fact, the assistant switches in the MUX may be implemented in any manner, which should not be limited to those described in this disclosure.

Figure 9:
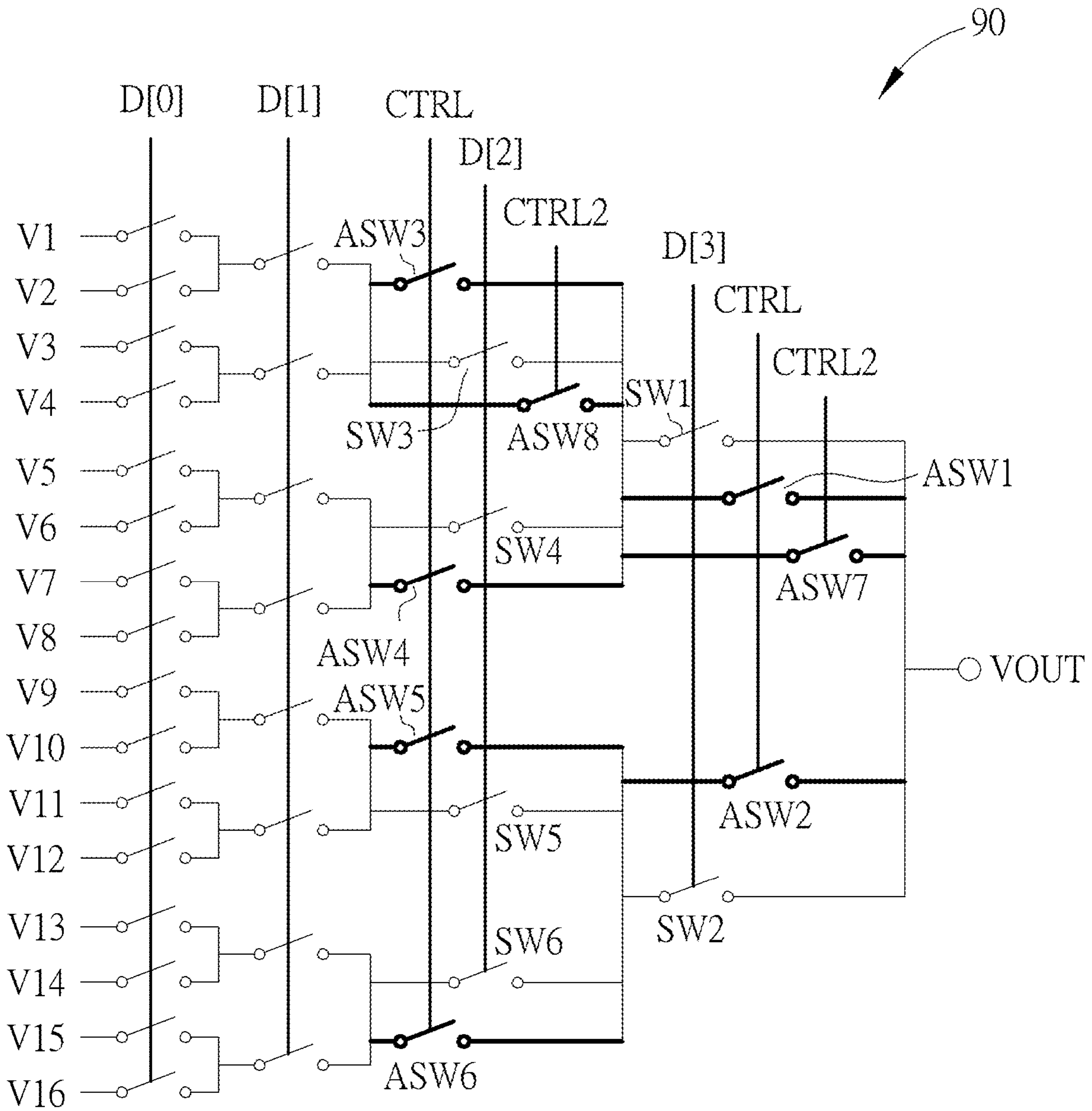

If there are multiple assistant switches included in a MUX, these assistant switches may receive the same control signal or different control signals. For example, in an embodiment shown in FIG. 9, there may be 8 assistant switches ASW1-ASW8 included in a MUX 90, where 6 assistant switches ASW1-ASW6 are deployed in a manner similar to those shown in FIGS. 7, and 2 assistant switches ASW7-ASW8 are deployed in a manner similar to those shown in FIG. 8. The assistant switches ASW1-ASW6 may receive a control signal CTRL, and the assistant switches ASW7-ASW8 may receive another control signal CTRL2. In an exemplary embodiment, the control signal CTRL turns on the corresponding assistant switches ASW1-ASW6 when at least one grayscale code changes, and the control signal CTRL2 turns on the corresponding assistant switches ASW7-ASW8 when the output voltage of the MUX has a significant variation. In such a situation, the control signal CTRL2 serves to provide further reduction of parasitic resistance under a larger voltage transition.

Note that the control signal of the present invention is used to control the assistant switch(s) of the MUX to be turned on at appropriate time, and may be generated in any possible manner. In order to achieve the purpose that the assistant switch is requested to be turned on when any of the grayscale codes changes, the control signal may be generated according to the grayscale codes received by the MUX.

Figure 10:
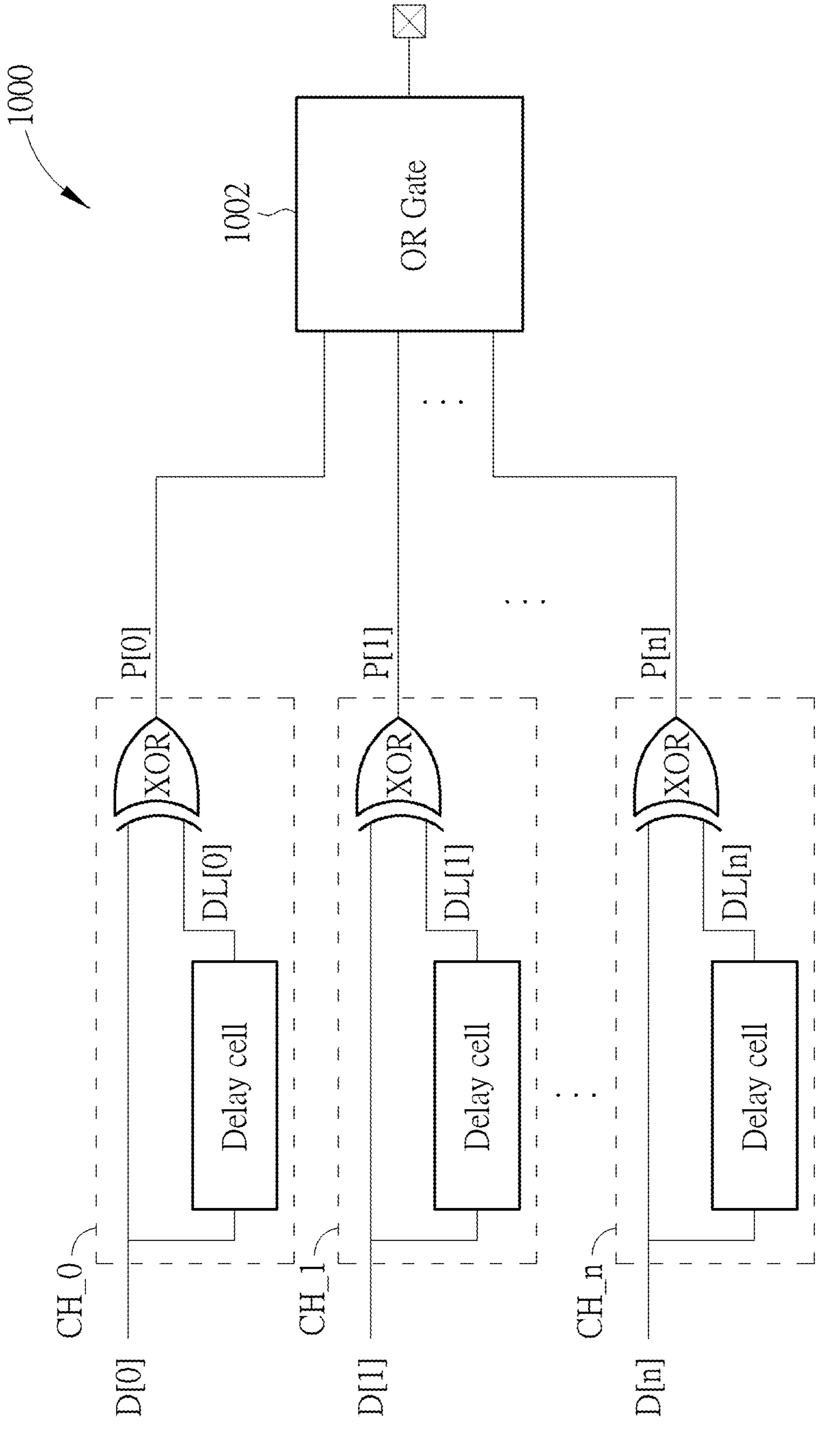
FIG. 10 is a schematic diagram of a control circuit according to an embodiment of the present invention.

FIG. 10 is a schematic diagram of a control circuit 1000 according to an embodiment of the present invention. The control circuit 1000 may be implemented to realize the control circuit 120 shown in FIG. 1, for generating the control signal CTRL for controlling the MUXs MUX_1-MUX_N. As shown in FIG. 10, the control circuit 1000 includes a plurality of channels CH_0-CH_n and an OR gate 1002. Each of the channels CH_0-CH_n has a delay cell and an exclusive-OR (XOR) gate. The delay cell may receive one of the grayscale codes D[0]-D[n] to generate a corresponding delayed grayscale code DL[0]-DL[n]. The XOR gate then performs an XOR operation on the received grayscale code D[0]-D[n] and the delayed grayscale code DL[0]-DL[n] to generate a pulse signal P[0]-P[n].

Subsequently, the OR gate 1002 may combine the pulse signals P[0]-P[n] to generate the control signal CTRL. More specifically, the OR gate 1002 may perform an OR operation on the pulse signals P[0]-P[n] to generate the control signal CTRL. As a result, a pulse may be generated on the control signal CTRL if any of the pulse signals P[0]-P[n] has a pulse, which means that any of the grayscale codes D[0]-D[n] changes.

In the above embodiment shown in FIG. 10, the pulse of the control signal CTRL is triggered by a change of any of the grayscale codes D[0]-D[n]. In another embodiment, the pulse of the control signal CTRL may be triggered only by detecting a change on several of the grayscale codes. For example, if the DAC or MUX is requested to improve the output transient response only when the output voltage has an evident change, the assistant switches may be turned on only when several MSBs of the grayscale codes change. In such a situation, the control circuit may receive partial grayscale codes (e.g., D[n-x]-D[n], which correspond to several MSBs of the grayscale codes) for generating the control signal CTRL.

To sum up, the present invention provides a novel structure of a DAC implemented in a source driver and used for selecting a gamma voltage based on the grayscale codes. The DAC may include one or more MUXs, each including a plurality of basic switches and one or more assistant switches, where each assistant switch may be connected in parallel with one of the basic switches. The basic switches may receive the corresponding grayscale codes, to select the desired gamma voltage as the output voltage of the DAC. The assistant switches may receive a control signal, on which a short pulse is generated to turn on the assistant switches for a period of time when any of the grayscale codes changes. In such a situation, when the grayscale codes change to cause that the output voltage transits to a new level, multiple voltage delivery paths connected in parallel between the output terminal of the DAC and the resistor ladder may be conducted simultaneously. As a result, the RC delay of the voltage transition may be reduced, which improves the transient response of the output voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog converter (DAC), comprising:
at least one multiplexer (MUX), each comprising:
a plurality of basic switches, coupled between an output terminal of the MUX and a plurality of input terminals of the MUX, and controlled by a plurality of grayscale codes; and
an assistant switch, coupled to the output terminal of the MUX, and controlled by a control signal different from each of the plurality of grayscale codes,
wherein the control signal is generated by a control circuit, which comprises:
a plurality of channels, each comprising:
a delay cell to delay a first grayscale code among the plurality of grayscale codes to generate a delayed grayscale code; and
an exclusive-OR gate, coupled to the delay cell, to perform a logic operation on the first grayscale code and the delayed grayscale code to generate a pulse signal; and
an OR gate, coupled to the plurality of channels, to combine the pulse signal of the plurality of channels to generate the control signal.

2. The DAC of claim 1, wherein the assistant switch is connected in parallel with a first basic switch among the plurality of basic switches.

3. The DAC of claim 2, wherein the first basic switch is one of the plurality of basic switches directly connected to the output terminal of the MUX without through any other basic switch.

4. The DAC of claim 2, wherein the assistant switch and the first basic switch are conducted simultaneously.

5. The DAC of claim 1, wherein the assistant switch is turned on when at least one of the plurality of grayscale codes changes.

6. The DAC of claim 1, further comprising:
a plurality of assistant switches, coupled to the output terminal of the MUX, and controlled by the control signal.

7. The DAC of claim 6, wherein the plurality of basic switches comprise a first basic switch coupled to at least one first input terminal among the plurality of input terminals and a second basic switch coupled to at least one second input terminal among the plurality of input terminals different from the at least one first input terminal, and the plurality of assistant switches comprise:
a first assistant switch connected in parallel with the first basic switch; and
a second assistant switch connected in parallel with the second basic switch.

8. The DAC of claim 1, wherein the control signal is generated according to at least one of the plurality of grayscale codes.

9. A display system, comprising:
a display panel;
a plurality of source operational amplifiers, coupled to the display panel;
a gamma circuit;
a control circuit to generate a control signal which is different from each of a plurality of grayscale codes; and
a digital-to-analog converter (DAC), comprising a plurality of multiplexers (MUXs), each of the plurality of MUXs having a plurality of input terminals coupled to the gamma circuit and an output terminal coupled to one of the plurality of source operational amplifiers, and comprising:
a plurality of basic switches, coupled between the output terminal of the MUX and the plurality of input terminals of the MUX, and controlled by the plurality of grayscale codes; and
an assistant switch, coupled to the output terminal of the MUX, and controlled by the control signal,
wherein the control circuit comprises:

a plurality of channels, each comprising:

a delay cell to delay a first grayscale code among the plurality of grayscale codes to generate a delayed grayscale code; and an exclusive-OR gate, coupled to the delay cell, to perform a logic operation on the first grayscale code and the delayed grayscale code to generate a pulse signal; and an OR gate, coupled to the plurality of channels, to combine the pulse signal of the plurality of channels to generate the control signal.

* * * * *